United States Patent [19]

Turner

[11] Patent Number: 4,810,883

[45] Date of Patent: Mar. 7, 1989

[54] DEVICE FOR PROVIDING AN ENERGY FILTERED CHARGE PARTICLE IMAGE

[76] Inventor: David W. Turner, 14 Jack Straws Lane, Headington, Oxford, England

[21] Appl. No.: 6,712

[22] PCT Filed: May 30, 1986

[86] PCT No.: PCT/GB86/00298
§ 371 Date: Jan. 29, 1987
§ 102(e) Date: Jan. 29, 1987

[87] PCT Pub. No.: WO86/07188
PCT Pub. Date: Dec. 4, 1986

[30] Foreign Application Priority Data

May 31, 1985 [GB] United Kingdom ............... 8513821
Dec. 5, 1985 [GB] United Kingdom ............... 8530011

[51] Int. Cl.$^4$ ..................... H01J 37/05; H01J 49/46
[52] U.S. Cl. ........................... 250/305; 250/281; 250/282
[58] Field of Search ............ 250/305, 281, 282, 294, 250/296, 297, 396 R

[56] References Cited

U.S. PATENT DOCUMENTS 3,437,805 4/1969 Brown ........................... 250/297

FOREIGN PATENT DOCUMENTS 0208894 1/1987 European Pat. Off. ............ 250/281
0522690 10/1981 U.S.S.R. ........................... 250/281

OTHER PUBLICATIONS

Tam et al., "Magnetically Collimated Electron Impact Spectrometer", Rev. Sci. Instr. 50(3), Mar. 1979.
Microscopie Electronique, 1970, Septieme Congris International De Microscopie Electronique, Grenoble (1970), pp. 179–180.
Grope et al., "Design of an ExB Filter with Improved Velocity Separating Capability", J. of Phys. E, Sci. Instrum., vol. 10, No. 5, May 1977.
Eyerton et al., "Modification of a Transmission Electron Microscope to Give Energy Filtered Images and Diffraction Patterns, and Electron Energy Loss Spectra", J. Phy. E., Sci. Instrum., vol. 8, 1975.
Lee, "A Nondispersive Electron Energy Analyzer for ESCA", Rev. Sci. Instrum., vol. 44, No. 7, Jul. 1973.

Primary Examiner—Bruce C. Anderson
Assistant Examiner—Paul A. Guss
Attorney, Agent, or Firm—Fleit, Jacobson, Cohn & Price

[57] ABSTRACT

A device for providing an energy filtered charged particle image particularly an electron image in the form of an electron energy analyzer which acts as a band-pass filter whilst maintaining the spatial integrity of the electron image in a uniform magnetic field. It embodies new electron optical properties wherein image electrons injected parallel to the magnetic field are guided, using crossed electrostatic and magnetic fields, to a low-pass electron mirror and then through a high-pass retardation filter. Non-uniform electrostatic deflection fields are used to compensate for the energy-dependent dispersion of the crossed fields whereby it is possible to correct for image distortion resulting from such dispersion.

18 Claims, 7 Drawing Sheets

DEVICE FOR PROVIDING AN ENERGY FILTERED CHARGE PARTICLE IMAGE

FIELD OF THE INVENTION

The present invention relates to a device for providing an energy filtered charged particle image particularly to such a device which is able to act as an energy band-pass filter whilst maintaining the spatial integrity of the image passing through the filter.

BACKGROUND ART

Charged particle emission such as electron emission from solid surfaces may be used to advantage in an imaging mode. In particular if an energy filtered image is produced the chemical morphology of a surface or the information about the excitation processes can be determined.

An engery filtered image is constructed from electrons with energies centered about $E_o$ and a band-pass of $+\delta E$. Techniques for producing energy filtered image fall into the following three catagories.

(1) Those in which the excited area on the object is much smaller than the collection area of the analyser aperture (the microprobe method). Examples of this group are Auger electron spectroscopy and backscattering in the scanning electron microscope.

(2) Those in which the area of the analyser aperture is much smaller than the excited area on the object (the selected area method). Examples are field-emission spectroscopy and the scanning photoelectron spectroscopies.

(3) Those in which the area of excitation (or its image) is much the same as the area of the analyser aperture (the whole-image method), for example the energy-selecting electron microscope and the magnetically-collimated emission spectromicroscope.

This disclosure is concerned with an imaging band-pass analyser for whole-image energy-filtering. Whole image techniques provide rapid signal collection over the total image area and thus can be particularly time efficient.

One problem in designing fixed band-pass energy analyser which operate in a magnetic field, is that there are no elementary transmission low-pass energy filters which will preserve an image. Consequently a retarding-field electron mirror is used which can in principle maintain the image geometry. To produce a usable filter however, the reflected filtered electron stream must be separated from the incoming stream. This can be achieved by using crossed electrostatic and magnetic fields in the region preceding the filter. In a cross-field region, electrons acquire a drift velocity, perpendicular to both field directions, irrespective of the initial direction of motion of the electrons. Consequently, electrons can be drifted into the electron mirror and out again along different paths.

Transmission high-pass energy filters based on electrostatic saddle fields are well known and capable of very high energy discrimination when applied to narrow beams. For uniform retardation across a wide stream, in the absence of a magnetic field, planar grids are needed with consequent obstruction of the image and sensitivity to the spatially varying micropotentials. When a magnetic field is coaxial with the electrostatic saddle field the effects of off-axis transverse electrostatic field components are largely suppressed, as will be discussed later. Thus it becomes possible, in principle, to dispense with grids.

A band-pass energy filter can therefore be constructed be directing the image electrons into an electron mirror then, using crossed field deflection, to a high-pass filter. Using a single electron mirror however results in a reversal of the beam direction in the analyser. The use of a second electron mirror, either before of after the high-pass filter, restores the direction of the initial beam. An advantage of using such a folded electron beam path is that the length of the analyser is reduced and it requires a smaller region of uniform magnetic field in which to operate.

As mentioned the low-pass electron mirror necessitates the use of crossed electrostatic and magnetic fields which serve to transport the image electrons from one stage of the analyser to the next. Unfortunately, in uniform crossed fields, this arrangement suffers from a severe defect. The drift imposed by the crossed fields is a function of the time that the electrons spend in the fields, consquently different energy electrons having different forward velocities are thus deflected by different amounts. This combined field and energy-dependent drift has two consequences for the image.

When the image is passed through the cross-field region the electrostatic field gradient across the entrance aperture, due to the electrostatic deflection field, causes the image electrons to be accelerated differently according to their position in the aperture. Those nearest the positive deflection plate are accelerated more than those near the negative one and hence gain forward velocity. Because of their greater forward velocity they spend less time in the deflection field and are displaced less than the slower electrons. This causes a non-linear shear of the image. The larger the voltage drop across the aperture the greater the magnitude of this effect.

Another consequence arising from the use of crossed fields with images is the energy-dependent displacement of the final image. Image electrons of different energy, even if they enter the crossed-field region at the same initial position, will be displaced by different amounts. This dispersion variation causes the different energy components of adjacent areas of the image to be superimposed into a composite image. This results in a smeared image, unless the band-pass width is very small.

In summary then the method of image transport through crossed fields introduces unwanted effects of non-uniform image shear and energy dependent dispersion, and it is an object of the present invention to correct for these deficiencies.

According to one aspect of the invention there is provided a method of providing an energy filtered charged particle image comprising, applying a crossed electrostatic and magnetic field to a beam of imaging charged particles to cause deflection thereof from an initial path of travel, reflecting the deflected beam in said field to effect energy filtering thereof, providing an output beam of energy filtered imaging charged particles from said reflecting travelling in a path displaced from said initial path, providing a non-uniform electrostatic field of the said crossed field, and configuring said non-uniform electrostatic field whereby to control motion of the charged particles in the crossed field and correct for distortion of the image in said output beam.

Employing the use of a non-uniform electrostatic field in the crossed field region as defined above, results in the setting up of electrostatic field components acting transverse to the direction of the applied magnetic field of the crossed field and whose magnitude varies with transverse distance. This variation accordingly allows the drift velocity in the direction orthogonal to those fields to be controlled at each transverse distance.

Accordingly this allows the time that the imaging particles spend in the crossed field to be controlled and the local transverse motion to be simultaneously controlled. By careful choice of the form of the non-uniform electrostatic field, the displacement function may be arranged so that image shear is removed over much of the image.

Non-uniform electrostatic fields to provide the effect required may be produced in a number of ways preferably, for example, by shaped plates to define the equipotentials required, selectively perforated or segmented plates or separately potentially biased wires.

Such preferred means will be described in more detail in the description of a preferred embodiment of the invention which follows later in this disclosure.

To further enhance the distortion correction, a second crossed field may preferably be employed equivalent to the first field, but with the difference that the sense of the second crossed field direction is reversed with respect to the first field such that the deflection occurring in the first field is wholly restorable by deflection in the second field.

The second crossed field therefore serves to coalesce the various images back into registration and correct any remaining image shear in the imaging particles from the first field.

As is applicable to a single pass through the first field only, eventual success in shear correction using two passes, will be dependent on the design of the non-uniform electrostatic fields employed.

The fields required will depend on the coordinate system in which the deflection is defined. In a rectilinear coordinate system in which the image must be transported laterally without rotation, fields which are invariant in the direction of motion will be required. An alternative arrangement would use a cylindrical coordinate system in which image motion occurs around a circle with concomitant rotation about its own centre.

According to another aspect of the invention there is provided a device for providing an energy filtered charged particle image comprising an entrance aperture for an input beam of imaging charged particles, means for forming a crossed electrostatic and magnetic field to deflect said input beam from an initial path of travel, means for reflecting the deflected beam to effect energy filtering thereof and provide an output beam of energy filtered imaging charged particles travelling in a path displaced from said initial path, and means for providing non-uniformity to said electrostatic field of the crossed field whereby to control motion of the charged particles in the crossed field and correct for distortion of the image in said output beam.

Other features and advantages of the present invention will become apparent as this disclosure proceeds to set forth more detailed ways and means of performing the invention and putting some into practical effect.

BRIEF DESCRIPTION OF THE DRAWINGS

Accordingly preferred embodiments of the invention will now be described taken with reference to the accompanying drawings wherein.

BEST MODES OF CARRYING OUT THE INVENTION

Figure 1:
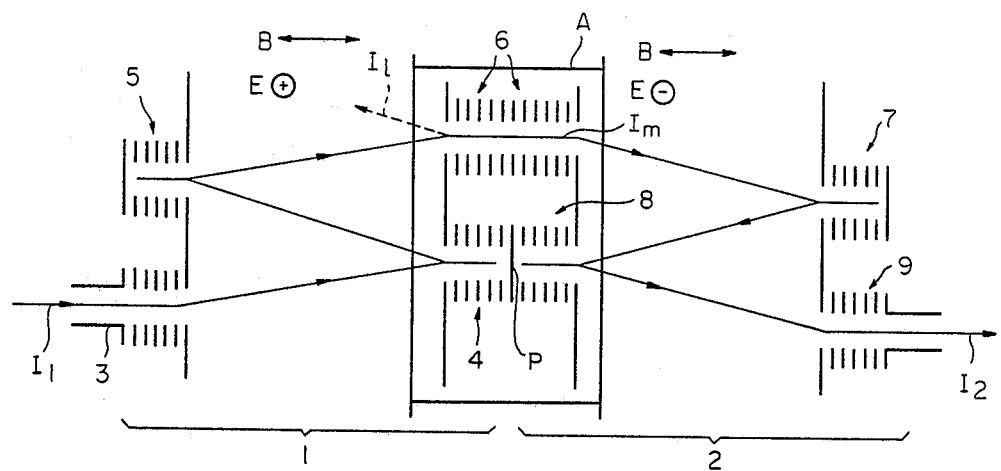
FIG. 1 is a schematic view of one form of an imaging band-pass electron energy analyser according to the invention.

The electron imaging band-pass analyser shown schematically in FIG. 1 is comprised of two stages 1 and 2.

The first stage 1 incorporates a crossed electrostatic field E and magnetic field B as shown, the direction of the magnetic field B being from left to right across the page of FIG. 1, while the electrostatic field direction E is into the page of FIG. 1 as indicated.

Additionally the first stage includes an entrance aperture 3 for an input beam of imaging electrons E, and consecutively axially offset, with respect to the axis of the aperture 3, an electron mirror 4 on the opposite side of the crossed E and B field region to aperture 3, an electron mirror 5 on the same side of the crossed E and B field region as the entrance aperture 3, and finally a high-pass energy filter 6 on the same side of the crossed E and B field region as the electron mirror 4.

The second stage 2 is equivalent to the first stage 1 comprising the high-pass energy filter 6, electron mirrors 7 and 8 and exit aperture 9 for an output beam $I_2$ containing an energy filtered electron image produced in the system as will be described. The exception from this equivalency is that the E field direction is the reverse of that in the first stage and out of the page of FIG. 1 as indicated.

In operation the first stage 1 acts to deflect the beam $I_1$ to the electron mirror 4 which in the example shown acts as a low band-pass energy filter for the imaging electrons in the beam $I_1$. In particular mirror 4 is a graded retardation potential.

High energy electrons in the beam $I_1$ which enter the retardation potential of mirror 4 are slowed, and if their initial energy exceeds the potential of the end plate P of the mirror 4, finally collide with it and are lost to the system. Electrons with an energy less than the potential applied to the end plate P are slowed by the field and finally reverse their direction.

The filtered low-pass energy electrons are then guided by the crossed E and B field to the electron mirror 5 and finally to the high-pass energy filter 6.

The high-pass filter 6 rejects the lower energy electrons which therefore re-enter the crossed field E and B region of stage 1 and are futher reflected as beam $I_L$ and are lost to the system.

The higher energy electrons defining the energy band-pass width as predetermined by the potentials applied to the filters 4 and 6, proceed into stage 2 of the analyser as beam $I_M$.

The purpose of the second stage 2 is to cancel any residual energy dependent dispersion in the beam $I_M$, return the beam $I_M$ to its original path of travel and introduce compensation for any shearing effects of the electron image in the beam.

The second stage 2 is consequently identical in construction to the first stage in the example shown, but, while providing identical field potentials, operates in an opposite field sense in that the electric force field E in stage 2 is oppositely directed to the electric force field E in stage 1.

The energy filtered image electrons therefore in output beam $I_M$ are guided to the exit aperture 9 via two further axially offset electron mirros 7 and 8 at opposite sides of the electric field E. The number of deflections (and consequently reflections) effected on the beam by the field E continues until an output beam $I_2$ through exit aperture 9 is produced travelling along a path corresponding to a restoration of the displacement of the original beam in stage 1 from the original path of travel $I_1$.

The success of the shear correction provided by the analyser as described with reference to FIG. 1 is dependent upon the design of the non-uniform electrostatic fields in the crossed field regions of the analyser.

Indeed it is to be observed that while FIG. 1 shows a two stage analyser in which the beam deflections in the crossed field of the first stage are reversed in the oppositely acting cross field of the second stage, appropriate design of the non-uniform electric field E in the first stage will produce a sufficiently distortion-free electron image in beam $I_M$ so that the second stage 2 could be dispensed with.

However, by sending beam $I_M$ "backwards" through the second stage 2 to coalesce any residual image electron dispersion back into registration the electron image in the final output beam $I_2$ is an enhancement of that in beam $I_M$ in terms of image resolution and absence of shear distortion.

The analyser shown in FIG. 1 is additionally provided with means, shown schematically at A, for adjusting the axial position of the high-pass filter 6 to lie on the axis of the entrance and exit apertures 3 and 9 so providing a direct path from entrance to exit to be used in the absence of transverse deflection to assist in the setting up of the associated apparatus involving only the high-pass energy filter 6.

Figure 2:
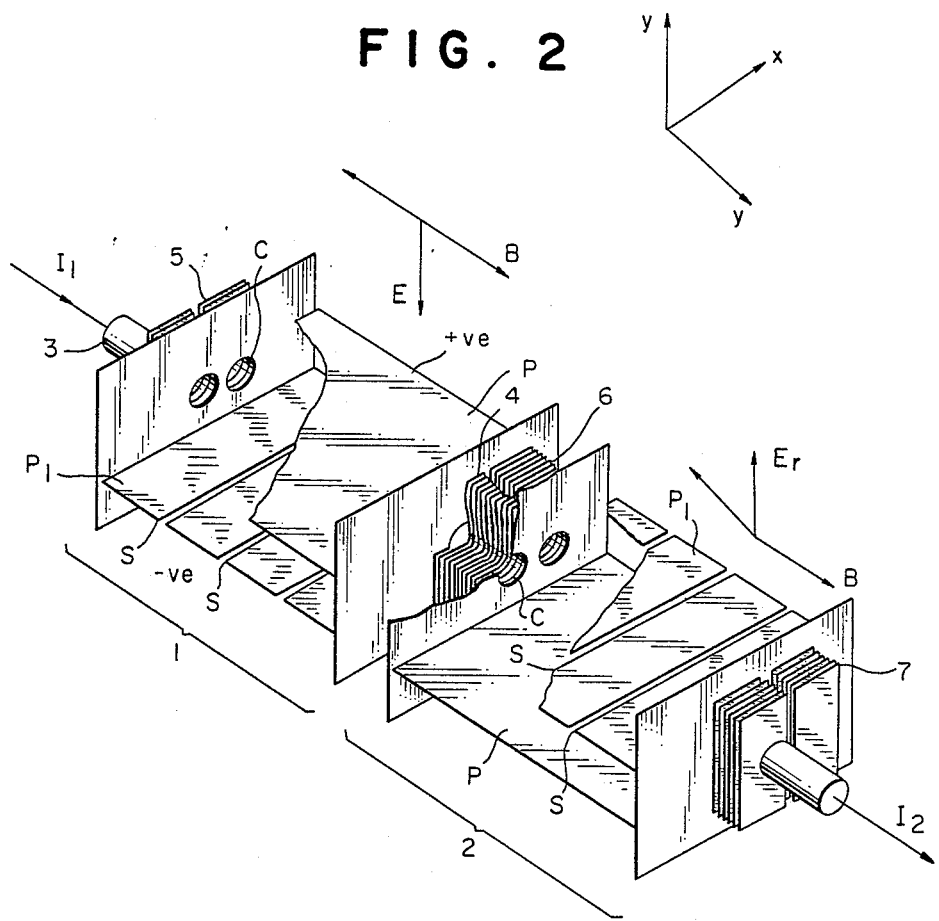
FIG. 2 is a perspective view of more detailed structure of a suitable imaging band-pass electron energy analyser according to the invention.

A more detailed analyser construction is shown in perspective view in FIG. 2, this including an illustration of one method of design of the electrodes for providing the necessary non-uniform electrostatic field for the crossed field regions of the analyser.

The components parts of the analyser construction of FIG. 2 similar to those of FIG. 1, have been denoted with the same reference numerals.

Thus the analyser in FIG. 2 has two stages 1 and 2 employing crossed field regions E and B and $E_r$ and B to effect beam deflection respectively in different directions as has been explained. In all cases the magnetic field B is uniform extending axially of the system.

The electron mirrors 4, 5, 7 and 8, acting as low-pass filters, are constructed in the form of stacked, circular apertured, as at C, and typically 1cm diameter, field electrodes having linearly graded potentials. These low-pass filters operate by absorbing high energy electrons on a carbon black surface and reflecting low energy electrons to then be deflected, as shown illustratively in FIG. 1, by the crossed E and B fields.

The high-pass filter 6 intermediate stage 1 and 2 is a retarding field electrode structure.

The band-pass energy filter stage 1 and image reconstruction and translation stage 2 are of identical construction, but as mentioned earlier, are mounted in opposition so that the transverse deflection occurring in stage 1 is followed by a compensating negative or reverse transverse deflection in stage 2.

Typically the spacing between the electrostatic deflection field plates P and $P_1$ is 2 cm and their total length is 10cm. The negatively biased field plate $P_1$ is divided into four equal sections by slits S.

The arrangement by which the plate $P_1$ is divided by slits S as shown in FIG. 2, provides one method of effecting a non-uniform electrostatic field in the crossed field regions E, B and $E_r$, B, for the purpose of correcting the variation of electron image displacement with position of entry in the y coordinate direction of the three dimensional coordinate axis system. For the purpose of the following description the x and z axis of that coordinate system with reference to the FIG. 2 constrction, are shown depicted in FIG. 2.

Thus the necessary condition for shear correction in cartesian coordinates may be shown to be satisfied by a field in which for a range of y coordinates a parabolic function of y is exhibited by V(y), the potentials at these coordinates in a field which is invariant with z (the coordinate along the magnetic field) or by $\overline{V}(y)$ which is an average value of this potential along the z axis in field which vary along the z coordinate. For small variations of V(y) with $z\overline{V}(y)$ may be taken as approximated to by the mean potential along the z axis. A better approximation is provided by the "square-mean-root" value. Under this condition the mean transverse motion becomes proportional to the mean axial motion.

This potential distribution may be approximated to in different ways, a simple one being based upon the field curvature associated with the penetration of field which occurs through apertures in electrode structures.

Thus, as shown in FIG. 2, the necessary curvature is produced by introducing the slots S extending in the x direction.

Choice of the width of the slots S in this example, allows the field penetration and hence the mean field curvature to be controlled together with control of the motion of the imaging electrons travelling in the deflection fields of the crossed field regions.

Figure 3A:
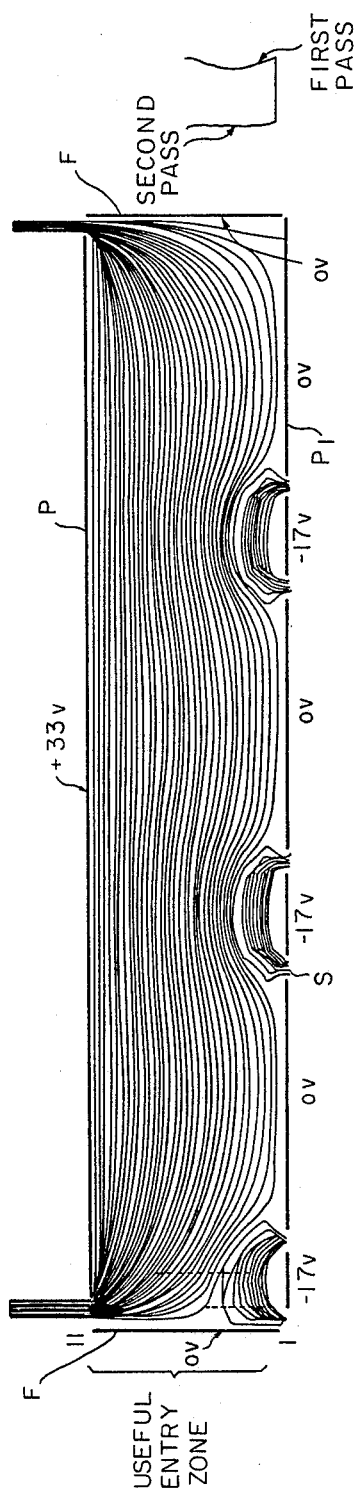
FIGS. 3(a) to 3(d) are contour diagrams illustrating various electrode structures for forming non-uniform electrostatic fields for the crossed fields of the analysers of FIGS. 1 and 2 together with corresponding ray traces demonstrating the calculated deflections of imaging electrons passing through such configured electrostatic field potentials.
Figure 3B:
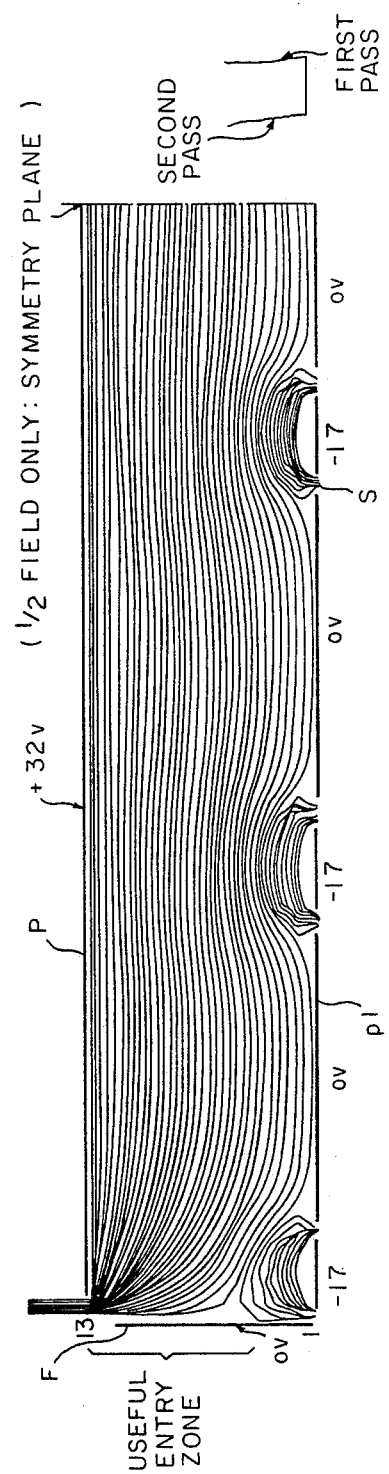

Some sample field curvatures which may be provided by a slotted negative plate construction of the type as shown for example at $P_1$ in FIG. 2, at various biased potentials with respect to themselves and negative with respect to the positive plate P, are shown in FIGS. 3(a) and 3(b).

The contour diagrams FIGS. 3(a) and 3(b) are at intervals of 1 volt and in respect of FIG. 3(a) represent a plot of half of the deflection field, that is to say midway along the electrode structure represented by plates P and P₁.

The transverse axis scale is labelled from 1 to 11 in FIG. 3(a) and 1 to 13 in FIG. 3(b) representing useful entry zones for imaging electrons.

In FIG. 3(a) the positive plate P is at 33 volts while the plate P₁ has a varying potential by having each segment of the plate P₁ provided by the slits S at different potentials alternatively between 0 and −17 volts with respect to the positive plate P.

The FIG. 3(b) arrangement is similar with the exception that the positive plate P is held at 32 volts.

The ray traces to the side of each of the contour diagrams 3(a) and 3(b) are representative of the calculated deflections in mm after passage through the part of the deflection field shown for the entrance electron kinetic energy indicated, that is 30 volts in the case of FIG. 3(a) and 20 volts in the case of FIG. 3(b), the curves, from right to left, being the calculated results of a first and then a second reversal pass through the two stage analyser.

These are the electron kinetic energy input values which afford minimum image shear distortion and that is to determine the optimum operating condition for the analyser.

Figure 3C:
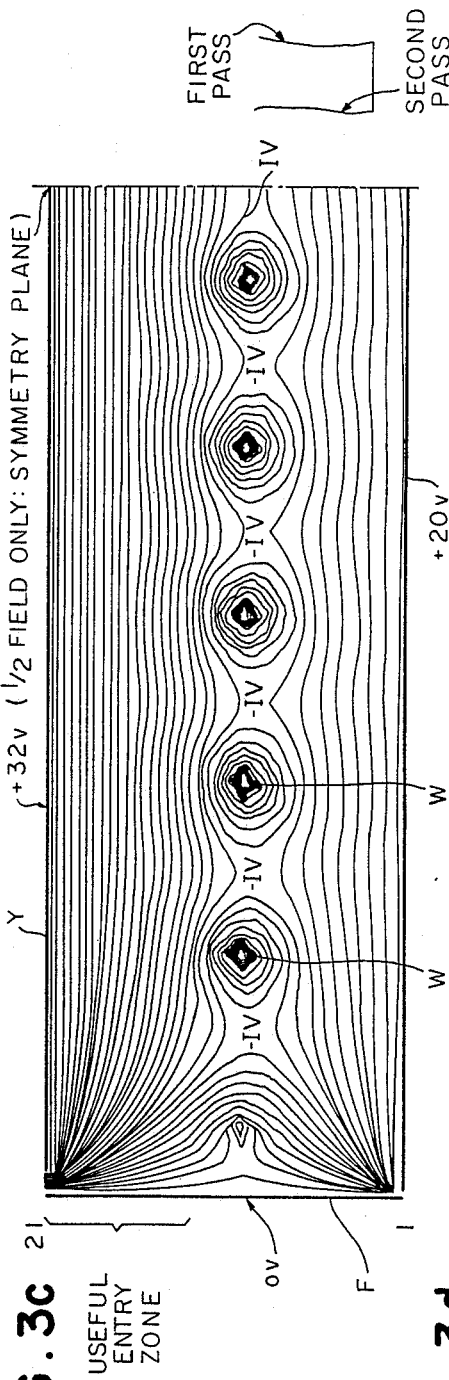
Figure 3D:
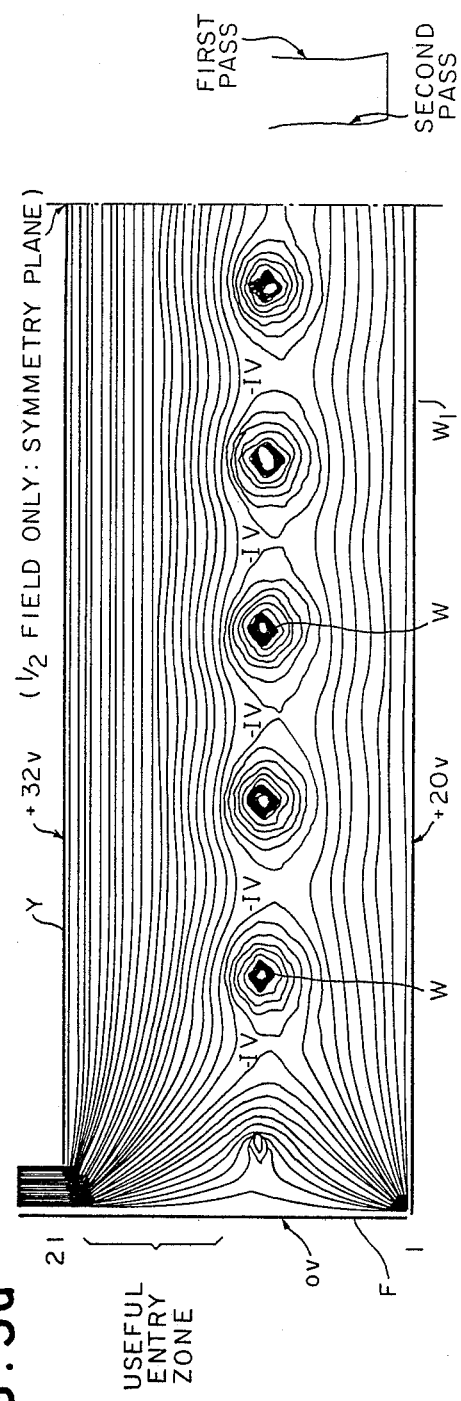

FIGS. 3(c) and 3(d) illustrate force field curvatures realisable with a modified form of electrostatic field plate structure to provide the non-uniformity required.

In these configurations the negative plate is composed of a series of wires W having a chosen spaced relationship, compared to the positive plate Y, and a second "negative" electrode W₁.

Each wire W is at the same negative potential, held at 1 volt, with respect to the plate Y which is held at +32 volts in the example shown.

The electrode W₁ is held at a potential of +20 volts, that is positive with respect to the electrode W but negative with respect to electrode Y.

The contour diagrams of FIGS. 3(c) and 3(d) represent a plot of half of the deflection field of the analyser, and the transverse axis scale of the plots is from 1 to 21.

The traces to each side of FIGS. 3(c) and 3(d) give calculated first and second pass deflection in mm after passage through part of the deflection field shown for an entrance electron kinetic energy of 2 volts.

In the FIG. 3 examples specific potentials for the differing electrode structures have been given and this together with choice of the widths of the slits S and spacing and adjustment (as the case may be) of the positive potential of the additional electrode W₁, allows the required field penetration and hence the mean field curvature to be controlled.

In the vicinity of the positive electrode P the required adjustment of the mean potential distribution may be obtained primarily by choice of spacing between the electrode P and the end reference electrodes denoted as F in FIG. 3, shown held at zero potential.

A simple computer model will now be discussed to enable optimisation of the final design of the analyser according to the invention.

Whilst analytical solutions can be found for electron trajectories in uniform or highly symmetric electric and magnetic fields, when this is not the case numerical ray-tracing programs are used to plot the electron trajectories.

In order to appraise the effects of different electrostatic field configurations in the analyser as described earlier, a simplified computer modelling method was used. There are constraints on the dimensions of the analyser imposed by the size of the final device, and also fundamental requirements for maintaining adiabaticity.

Figure 4:
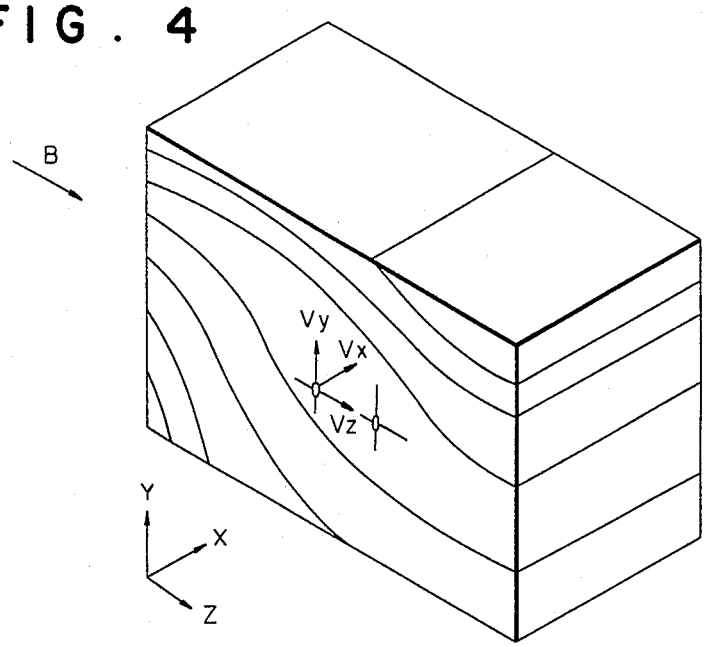
FIG. 4 is an illustration of the axis system employed in the construction of a computer model for a single pass of the transverse electrostatic field region of the analyser of FIGS. 1 or 2.

The important quantities which relate to the apparatus parameters and dimensions, in the axis system used in FIG. 4 are:

(1) The maximum helix pitch length for the electron motion in the magnetic field alone, $d_Z$.

(2) The maximum transverse displacement induced by the $E_y$ field $\pm d_y$.

(3) Any additional transverse displacement, $d_x$, arising from a non-zero component of transverse velocity perceived by the electron before it enters the $E_y$ field.

(4) The step interval over which the field components are sensibly constant $\Delta x$, $\Delta y$, $\Delta z$.

The principle inequalities which need to be satisfied for dispersion correction, without further abberations induced by adiabaticity departure, in a non-uniform electrostatic field are:

(i) $d_z \Delta z$ (ii) $d_y \Delta y$

In the context of the PESM experiment see the article by Beamson, Porter & Turner Nature London 290, 556 (1981), where an intermediate magnetic field strength of 0.025 T is found between the high field region of a superconducting solenoid (8 T) and the image recording region (0.08 mT), the magnitudes of these terms determine the physical scale of any possible analyser structure. Thus in this 0.025 T magnetic field for electrons in the energy range 2–20 eV, oriented along the z axis, $d_z$ varies from 1.2 to 3.8 mm.

Consequently, to avoid adiabatic breakdown, all of the fields encountered in the analyser must vary slowly over these magnitudes of distance and in consequence, electrode structures extending over tens of centimeters will be required. In the example analyser described herein, both a lower field than this and electrode structures for which the above conditions are close to their limiting values were employed.

The electron motion was treated as non-relativistic and adiabatic. Only individual electron trajectories were considered and no allowance was made for the effects of space charge. The magnetic field, $B_z$, is uniform in the z direction. Several simplifying approximations were made:

(1) The motion of an electron is represented by a guiding centre approximation. The cyclotron motion of the electron, and the displacement this causes from the guiding flux line is ignored and the magnitude of the mean transverse drift velocity is given by $E_y/B_z$.

(2) The forward velocity component of the electron $v_z$, is calculated at any point by adding the initial energy of the electron to the potential of the electrostatic field at that point.

(3) The electrostatic deflection field is assumed to have no components in the deflection direction. Thus the electrostatic field is treated as purely a two dimensional field. This means that fringing field axial components at the entrance and exit apertures are not considered in this stage.

The computer program generates the electrostatic fields from the electrode configurations in two dimensions. The fields are calculated by solving Poisson's equation by a Jacobi type relaxation on an array of 60×30 points. An eight bit microcomputer was used to obtain a rapid approximation of the performance of different non-uniform electrostatic field configurations. The programs are written in FORTRAN 80 and take between 10 and 30 minutes for a solution to be reached depending on the electrode geometry and precision required.

The two dimensional field, calculated by the Jacobi relaxation of the electrode structures, represents the electrostatic field found between electrodes of infinite extend in the x direction, see FIG. 4. Electrons are injected into this calculated field and at each x-y plane a deflection, x, is computed by taking the local $E_y$ field from the field calculation and the velocity in the z direction, $v_z$, by calculating the sum of the initial electron kinetic energy and the potential at that point in the field. The time, $\delta t$, the electron spends in this E-field between adjacent x-y planes is hence known from $v_z$. The magnetic field, $B_z$, is constant so the displacement $$\delta x = \delta t \cdot E_y / B_z$$

can be calculated. The displacement is summed on moving along the z direction sampling each x-y plane.

Figure 5A:
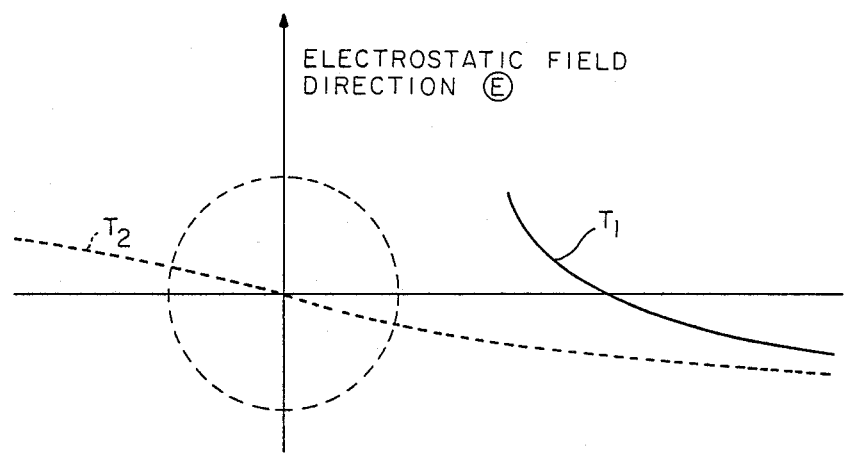
FIGS. 5(a) and 5(b) are graphical illustrations of a computer simulation of a bar of monoenergetic electrons after passage through the crossed field regions of the analyser of the form shown in FIG. 2.
Figure 5B:
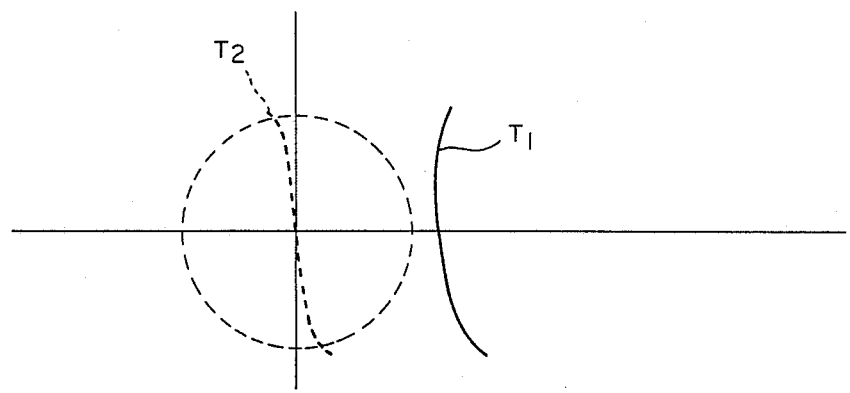

A comparison of the final transverse displacement of a vertical bar of monoenergetic electrons after passing through crossed field regions employing electrostatic field configurations provided in one case by two plates of equal length and opposite potential, and in the other case by the analyser of FIG. 2, is displayed graphically in FIGS. 5(a), 5(b) respectively.

The monoenergetic bar represents the image resulting from these electrons passing through a narrow slit and then in the case of the full trace $T_1$ in FIGS. 5(a) and 5(b), through a single pass in a crossed deflection field, and the broken trace $T_2$, a subsequent reversed deflection region.

The effects of the second crossed field is approximated by applying the calculated displacement function to its image reflected about the x direction, see FIG. 4.

The displacement caused by a potential distribution which is symmetric about the potential of the end plates is shown in FIG. 5(a); the subsequent distortion of the image by transmission through the two crossed field regions that is as between traces $T_1$ and $T_2$ in FIG. 5(a), is clearly apparent.

FIG. 5(b) however shows the displacement calculated by a computer model for the actual electrostatic field arrangement as described herein. The non-linear image shear as between traces $T_1$ and $T_2$ in FIG. 5(b) for two passes in consecutive deflection and reversed deflection crossed fields, used in the computer model can be seen to have been corrected over most of the image.

Initial results have thus shown:
(1) The simplified model produced correctly the expected form of non-linear image shear in uniform electrostatic fields, as predicted analytically and found experimentally in trochoidal deflection experiments conducted in the PESM, see the paper by Turner, Plummer & Porter J Microscopy 136, 259 (1984).
(2) Non-uniform electrostatic fields may be found which reduce the non-linear shear. In some cases, with a narrow pass-band, both the non-uniformity of the shear and the shear itself may be eliminated.

In summary, the regions of the field distribution which most strongly affect the lateral deflection are in the vicinity of the electrode of lowest potential where the axial velocity, $v_z$, must be least; and in the region between the end plate which determines the reference potential and the positive field-generating electrode. In this fringing field, electrons encounter regions of locally high transverse electric field component ($E_y$). Therefore minor adjustments of the local potential near to the end of the deflection region provides a means of optimising the performance of the analyser during operation. Elaborate electrode structures can be designed to give a more complete removal of the image shear but at the expense of a reduced overall displacement.

With unlimited space in the z direction the electron energy filters used in stages 1 and 2 of the analyzer may in principle, be constructed with a large number of field electrodes defining a set of planar equipotential surfaces, normal at all points to the direction of the uniform magnetic field. In practice, truncation of these structures produces non-planar fields due to electrostatic field penetration at their entrance and exit apertures. These equipotentials have components which are perpendicular to the axis of the magnetic field, and introduce an image rotation which is radially varying within the aperture of the mirror.

The magnitude of this image rotation is additive since the sense of rotation in the apparatus frame of reference is independent of the direction of electron motion and is experienced in each of the four electron mirrors 4, 5, 7 and 8 and twice in the high-pass filters 6. The magnitude of this effect is thus important and has been calculated in a manner analogous to that described earlier for calculating the transverse displacement. The electrostatic field at a single electron mirror is modelled in cylindrical symmetry using the appropriate Jacobi relaxation. Here the crossed field drift is in the azimuthal coordinate of an axially symmetric mirror field and the electrostatic component producing the crossed field drift is the radial component of the electrostatic field of a selected radius. As before, the calculation is followed parallel to the z axis and the now perpendicular motion is summed.

Figure 6:
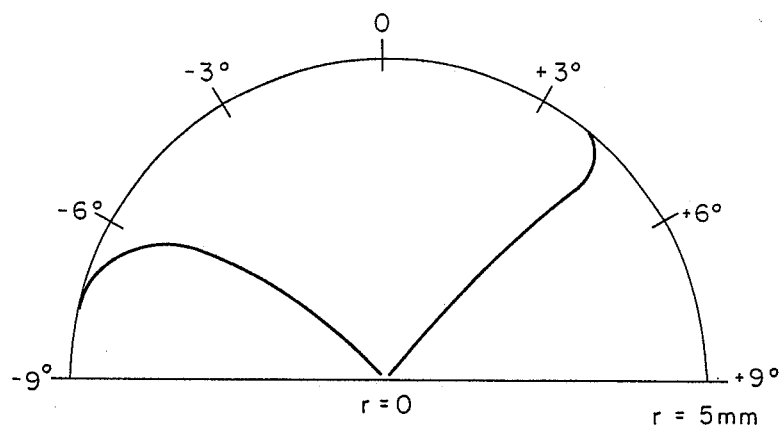
FIG. 6 is a computer simulation of image rotation for a bar of 18 eV electrons after passing through (i) of saddle field high-pass energy state and (ii) entering and exiting a sequence of four electron mirrors.

FIG. 6 shows the computed image rotation for a single pasage through the high-pass filter 6 of the analyser and for four successive reflections in the field, corresponding to the low-pass electrode structures 4, 5, 7 and 8 with the analyser described above. This field was generated assuming the retarding electrode structure connects to a field free region, with any effect of the two-dimensional deflection field being neglected. The calculations assume a magnetic field strength of 0.025 T for which the length of the filter regions is 3 $d_z$.

The angular rotation expanded scale is in 3° divisions and the result indicates that after reflection in four such mirrors the total image rotation can be approximately balanced by the opposite action of the high-pass filter. Interestingly the rotation in each electron mirror is nearly constant for energies down to 70% of the pass energy and appears to be almost independent of the radius over most of the aperture.

An analyser as described with reference to FIG. 2 and based on the predictions of the computer model, was designed and constructed to operate in a test apparatus which employed magnetic collimation. The test apparatus provides a 0.0125 Tesla magnetic field from an 11 cm diameter solenoid 38 cm long. This imposes constraints on the analyser dimensions, which result in conditions of operation which are close to the critical limits imposed by the requirements for adiabatic motion described above. At one end of the solenoid is an iron-coated monopole lens. This generates a divergent magnetic field which expands into that of the solenoid.

A tungsten filament situated near the monopole acts as the electron source for testing the analyser. The magnetic field in the filament region was approximately 0.2 Tesla. With these magnetic fields an image of the filament was produced, with a magnification of 4–5×, in which all the electron trajectories lie within 13° of the axis as a result of momentum interconversion. This corresponds to having at least 97% of their total energy oriented in the magnetic field direction.

The image of the tungsten filament was formed on a W800 phosphor screen, which is particularly sensitive to electrons of a few hundred eV, placed behind a fine electro-formed mesh (from a Plumbicon TV tube). The electrons were accelerated by 4 kV onto the phosphor screen. The mesh is essential to define a uniform potential barrier for the image electrons. It can also be negatively biased to act as an alternative high-pass filter to that in the centre of the analyser.

Given the dimensions of the analyser, electrostatic deflection fields of the order of 2000 V/m are needed to deflect low energy electrons (1–30 eV) from the entrance aperture to the first electron mirror 4 and subsequently through the analyser.

The analyser was constructed from vacuum compatible materials; cooper, glass, boron nitride and Teflon. All electrode surfaces were polished and coated with aerosol graphite spray (Graphit). In addition, those surfaces liable to be encountered by electrons; the entrance aperture, the mirrors, and the high-pass filter, were soot-coated with a toluene flame to reduce their electron reflection.

The results of the above experiments will now be discussed. Firstly the imaging ability of the analyser is demonstrated with a wide energy pass-band. The effect of narrowing the pass-band is shown and finally the ability to collect an electron energy spectrum, at constant bandwidth, from a spatially extended electron source is presented.

The transverse deflection required to allow the electrons entering the analyser to pass through the high-pass filter 6 is 22.5 mm. The analyser potentials and electron energy with respect to the tungsten filament were set to values which the computer model indicated would allow the beam to travel through the centre of each of the components and also provide some reconstruction of the image. The computer model suggested a number of possible non-uniform electrostatic field configurations for initial investigation. The simplest field had the negative electrode divided into four equal parts as shown in FIG. 2 with one set to $-\frac{1}{2}$ V+ and the others at 0 V and an electron energy $E_e$, of 20 eV.

Figure 7A:
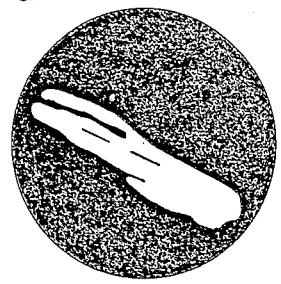
FIGS. 7(a) to 7(c) are photographs of the image on a phosphor screen of a coiled tungsten filament after passage through the analyser of FIGS. 1 or 2 at different settings of the electrostatic crossed field and band-pass width and FIG. 8 is a graph of the electron spectra obtained from a straight tungsten filament at two different band-pass widths.
Figure 7B:
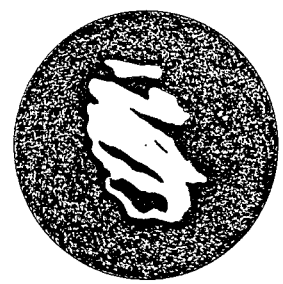

With this configuration a recognizable image of the coiled filament was obtained when deflection fields of V+ = 35.2 V, V− = −18.5 V, 0 V, 0 V were applied see FIG. 7(b), whereas a symmetrical field with V± = 16 V gave an extremely smeared, unrecognisable image FIG. 7(a). The general form of the image resembles that predicted by the computation. For this example the energy pass band was set to be larger than the electron energy distribution from the source (thermionic distribution+voltage drop across the filament).

Figure 7C:
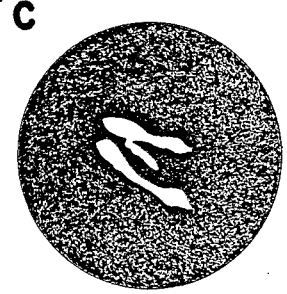

FIG. 7(c) however shows the effect of narrowing the pass-band to about 0.2 eV, which is comparable to the voltage drop across one turn of the filament. This demonstrates the feasibility of narrow pass band filtering of magnetically collimated images.

Figure 8:
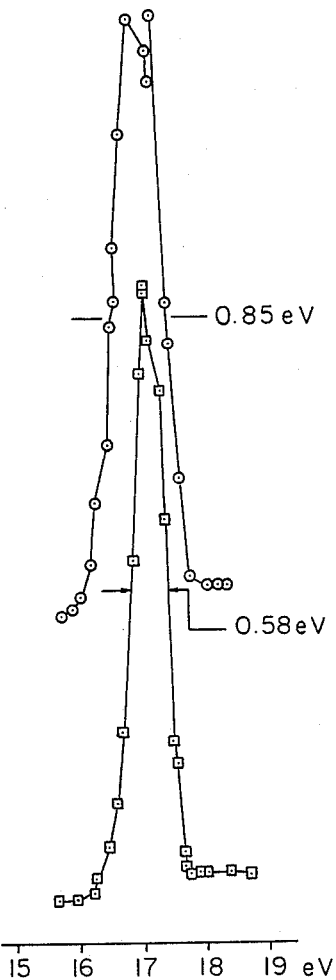

The analyser can also be made to function primarily as an energy analyser with a very high collection efficiency. The new analyser offers continuous (DC) operation and a direct differential output together with a constant sensitivity for a particular bandwidth. This mode of operation is demonstrated using the image of a section of a straight filament for which the potential drop over the image section is =0.2 V, significantly less than the thermal spread. FIG. 8 shows the spectrum for two different pass-band settings (0.04 V and 0.10 V) obtained from a straight tungsten filament by recording the electron intensity reaching the screen as a function of the retardation applied to the whole analyser.

The low energy background on the signal is caused by energy loss and momentum interconversion of the high energy electrons on colision with the electrodes in the analyser.

A number of instrumental factors contribute to the energy spread in the recorded peak. The high-pass retardation filter between the two stages of the present analyser suffers from field penetration producing a non-uniform retardation field. In addition any surface micropotentials, especially on retardation electrodes, leads to energy broadening. These effects can be minimised by changing the dimensions of the retardation region and uniformly coating all electrodes. High energy electrons which impinge on electrodes in the analyser can yield lower energy electrons by energy-loss collision processes and electrons with lower forward momentum by velocity reorientation on collision. Both these processes contribute to an electron background and result in the reduction of contrast in the final image. This has been reduced by coating all the surfaces with carbon black, which has a low electron reflection coefficient. An alternative strategy, for example, would be to use meshes backed by positive-biased plates to absorb electrons.

It has been shown that using simple computer models it is possible to design an imaging band-pass electron analyser according to the principles of the invention. The analyser performs satisfactorily for the simplest field geometry predicted by these models. Using a more sophisticated modelling program, in which the Newtonian equations of motion of the electron in electrostatic and magnetic fields were solved iteratively, basically the same result was obtained. This technique modelled the detail of the electron trajectories (ie the cyclotron orbit) but was many times slower to run.

Computer modelling predicts that a bandwidth as large as 3–5 eV may be attained before image distortion becomes marked, being limited mainly by the ability to produce the required electrostatic fields. The minimum band-pass, as in most electron analysers, is set by the influence of non-uniform surface potentials and consequently a minimum band-pass of less than 10 meV is expected.

The image area over which the present prototype analyser is effective is around 1 $cm^2$, but this is not a limitation on the size of the final image since post-analyser magnification can be used. It is proposed to place an imaging band-pass analyser in the photoelectron spectromicroscope, at an intermediate position between the sample and the imaging detector. Momentum collimation and magnification will occur in the divergent magnetic field region in front of the analyser, which is situated in a uniform magnetic field region of field strength of 0.025 T. The magnetic field can diverge again after energy analysis to produce a final image magnification of any desired amount, subject to the constraint that the rate of change of magnetic field must not be large enough to perturb adiabatic motion.

Although the preferred embodiment of the invention has been described wherein the charged particles are electrons, nevertheless it is to be understood that the invention would be equally useful for dealing with other charged particles for example positrons, as foreshadowed in the preamble to this disclosure and acknowledged by the use of the bidirectional arrow to illustrate the magnetic field direction in FIGS. 1 and 2.

I claim:

1. A method of providing an energy filtered charged particle image comprising
    applying a first crossed electrostatic and magnetic field to a beam of imaging charged particles to cause deflection thereof from an intital path of travel,
    reflecting a deflected beam in said field to effect charged particle energy filtering thereof,
    providing an output beam of energy filtered imaging charged particles from said reflecting travelling of said beam of imaging charged particles in a path displaced from said initial path,
    providing a non-uniform electrostatic field of said crossed field, and
    configuring said non-uniform electrostatic field to control motion of the particles in the crossed field and correct for distortion of the electron image in said output beam.

2. A method as claimed in claim 1 wherein said controlling of the motion of the particles is effected by
    arranging for said non-uniform electrostatic field to provide predetermined electrostatic force field components acting transverse to the direction of the applied magnetic field, wherein the magnitude of said components varies with transverse distance in the electrostatic field.

3. A method as claimed in claim 2 wherein said arranging is effected by
    applying a uniform potential to the imaging particles along the direction of movement of the imaging particles as constrained by the magnetic field of said crossed field and
    applying a non-uniform potential to the imaging particles spaced from said uniform potential, the non-uniformity being effected by varying the potential along the said direction, negatively with respect to said uniform potential.

4. A method as claimed in claim 1 including
    applying a second crossed electrostatic and magnetic field to said output beam equivalent to said first mentioned crossed field.
    arranging for said second field to act on said output beam to cause reverse but equal deflection of said output beam with respect to the deflection in said first field,
    reflecting said reverse deflected beam in said second field, and
    providing a final output beam of substantially non-distorted band-pass energy filtered imaging particles from said reflecting travelling in a path corresponding to a restoration of the path of said input beam to said first crossed field.

5. A method as claimed in claim 4 including
    choosing a band-pass energy width for the imaging particles, and
    providing energy filtering of the particle image in said input beam such that the output beam from the first crossed field contains imaging particles in said chosen band-pass width.

6. A device for providing an energy filtered charged particle image comprising
    an entrance aperture for an input beam of imaging particles,
    means for forming a first crossed electrostatic and magnetic field to deflect said input beam from an initial path of travel,
    means for reflecting a deflected beam to effect particle energy filtering thereof and provide an output beam of energy filtered imaging particles travelling in a path displaced from said initial path and
    means for providing non-uniformity to said electrostatic field of the crossed field to control motion of the particles in the crossed field and correct for distortion of the particle image in said output beam.

7. A device as claimed in claim 6 wherein said means comprises
    first electrode means of the electrostatic field for applying a uniform potential to the imaging particles along the direction of motion of the imaging electrons as constrained by the magnetic field of said crossed field,
    second electrode means of the electrostatic field for applying a non-uniform potential to the imaging particles spaced from said first electrode means, said second electrode means being configured to provide a varying potential along the said direction of motion of the imaging particles, negatively with respect to the potential of said first electrode means.

8. A device as claimed in claim 7 wherein
    said second electrode means is formed of a pair of electrode structures both negative with respect to said first electrode means,
    one of said pair of electrode structures having apertures or slots transverse to the said direction of motion of the imaging particles and being arranged between said first electrode means and the other one of said pair of electrode structures, and
    said one of said pair of electrode structures being negatively biased with respect to said first electrode means and said other one electrode structure.

9. A device as claimed in claim 8 wherein
    said one of said pair of electrode structures is comprised of spaced wires each separately potentially biased.

10. A device as claimed in claim 6 further comprising
    means for forming a second crossed electrostatic and magnetic field equivalent but acting in the opposite sense to said first mentioned crossed field to cause equal but reverse deflection of said output beam with respect to deflection in the said first mentioned field, and
    means of reflecting the thus reversely deflected output beam from the first mentioned crossed field to provide a final output beam of substantially non-distorted band-passs energy filtered imaging particles from said reflecting in the second crossed field travelling in a path corresponding to a restoration of the path of said input beam to said first crossed field.

11. A device as claimed in claim 10 including high and low band-pass energy filter means for energy filtering said input beam such that the output beam from the first crossed field contains imaging particles in a chosen band-pass width.

12. A device as claimed in claim 11 wherein said low band-pass energy filter means being constituted by charged particle mirror means of said reflecting means in the first crossed field.

13. A device as claimed in claim 11 wherein said high band-pass energy filter means being a retarding field filter acting subsequent to said low band-pass energy filter means such that said output beam from said first mentioned crossed field contains energy band-pass imaging particles.

14. A device for providing a band-pass energy filtered charged particle image comprising an inlet aperture, an outlet aperture, means between the inlet and the outlet aperture for energy filtering of an input beam of imaging particles directed through the inlet aperture to provide an output beam of band-pass energy filtered imaging charged particles directed through the outlet aperture, first and second crossed electrostatic and magnetic fields between the inlet and outlet aperture, said first field effecting a first deflection upon the input beam to provide an intermediate beam travelling along a path displaced from the path of said input beam, said second field effecting a deflection of said intermediate beam opposite to the first mentioned deflection to provide said output beam travelling along a path corresponding to a restoration of the path of said input beam to said inlet aperture, and means for providing a non-uniform electrostatic field of said first and second crossed fields to control motion of the particles in the crossed fields and correct for distortion of the particle image during passage of the beam of imaging particles from said input to said output aperture.

15. A device as claimed in claim 14 wherein said energy filtering means is a low band-pass energy filter in said first crossed field and a high band-pass energy filter intermediate said first and second crossed fields.

16. A device as claimed in claim 14 wherein said inlet and outlet apertures are coaxial, so that the path of said output beam is in the same direction as and coaxial with that of the input beam.

17. A device as claimed in claim 16 wherein said input beam is reflected twice by means of a pair of charged particle mirrors during deflection in said first crossed field to effect the displaced path of said intermediate beam, one of said mirrors constituting said low band-pass energy filter.

18. A device as claimed in claim 17 wherein said high band-pass energy filter is positioned in said displaced path of the input beam such that said intermediate beam contains a band-pass energy filtered charged particle image.

* * * * *